(12) United States Patent
Fujii et al.

(10) Patent No.: US 6,734,692 B2
(45) Date of Patent: May 11, 2004

(54) INSPECTION APPARATUS AND SENSOR

(75) Inventors: Tatuhisa Fujii, Fukuyama (JP); Shogo Ishioka, Fukayasu-gun (JP); Shuji Yamaoka, Fukuyama (JP)

(73) Assignee: OHT Inc., Hiroshima (JP)

( * ) Notice: Subject to any disclaimer, the term of this patent is extended or adjusted under 35 U.S.C. 154(b) by 204 days.

(21) Appl. No.: 09/926,357

(22) PCT Filed: Feb. 21, 2001

(86) PCT No.: PCT/JP01/01243
§ 371 (c)(1),
(2), (4) Date: Oct. 22, 2001

(87) PCT Pub. No.: WO01/63307
PCT Pub. Date: Aug. 30, 2001

(65) Prior Publication Data
US 2002/0140448 A1 Oct. 3, 2002

(30) Foreign Application Priority Data
Feb. 22, 2000 (JP) ......................................... 2000-044705

(51) Int. Cl.[7] ............................................... G01R 31/02
(52) U.S. Cl. .................... 324/763; 324/765; 324/158.1; 324/537; 324/538
(58) Field of Search ................................ 324/765, 763, 324/158.1, 769, 754, 758, 537, 538, 66, 67, 95, 523

(56) References Cited

U.S. PATENT DOCUMENTS

| 4,130,794 A | * | 12/1978 | Cox | 324/538 |
| 5,517,110 A | * | 5/1996 | Soiferman | 324/158.1 |
| 5,696,451 A | * | 12/1997 | Keirn et al. | 324/687 |
| 6,097,202 A | * | 8/2000 | Takahashi | 324/761 |
| 6,373,258 B2 | * | 4/2002 | Takada | 324/537 |
| 6,445,204 B1 | * | 9/2002 | He et al. | 324/763 |

FOREIGN PATENT DOCUMENTS

| GB | 2307754 | * | 6/1997 | .......... G01R/31/28 |

* cited by examiner

Primary Examiner—Evan Pert
Assistant Examiner—Jimmy Nguyen
(74) Attorney, Agent, or Firm—Westerman, Hattori, Daniels & Adrian, LLP

(57) ABSTRACT

It is an object of the present invention to finely inspect a dimension of a conductive pattern.

A sensor element 12a includes an MOSFET. A diffusion layer of the MOSFET having a larger surface area serves as a passive element, and is placed opposes to the conductive pattern. The passive element is formed continuously with a source of the MOSFET to be electrically conductive thereto. A gate of the MOSFET is connected to a vertical select section 14, and a drain of the MOSFET is connected to a lateral select section 13. When a sensor element 12a is selected by a timing generating section 15, a signal is transmitted from the vertical select section 14 to the gate to turn on the MOSFET. In this moment, if an inspection signal is output from a probe 22, the potential in the conductive pattern 101 is varied. Thus, a current flows from the source to the drain and then the current is transmitted to a signal processing section 16 through the lateral select section 13. By analyzing the position of the sensor element which outputs a detect signal, the position of the conductive pattern 101 in a circuit board 100 may be discriminated.

14 Claims, 15 Drawing Sheets

INSPECTION APPARATUS AND SENSOR

TECHNICAL FIELD

The present invention relates to an inspection apparatus for a conductive pattern of a circuit board and to a sensor for the inspection apparatus.

BACKGROUND ART

In manufacturing processes of a circuit board, after forming an electrically conductive pattern on a board, it is required to inspect the presence of disconnection and/or short-circuit in the conductive pattern.

As for such an inspection technique, a contact type inspection technique has been heretofore known in which a conductive pattern was subjected to a continuity check or the like by bringing two separate pins into contact with the opposed ends of the conductive pattern to apply an electric signal from one of the two pins to the conductive pattern ant then receive the electric signal through the other pin.

However, recent progressive densification in the conductive pattern makes it difficult to assure a sufficient space for arranging the pins simultaneously and bringing them into contact with the conductive pattern to be inspected. Thus, a non-contact type inspection method has been proposed in which the electric signal was received without using any pin and contacting the conductive pattern (see Japanese patent Laid-Open publication No. Hei. 09-264919).

As shown in FIG. 15, in this non-contact type inspection technique, the disconnection or the like in the conductive pattern is inspected by bringing a pin into contact with one of the ends of a circuit wiring of the conductive pattern to be inspected, placing a sensor conductor at the other end of the conductive pattern in a non-contact manner, and then detecting with the sensor conductor a potential variation in the conductive pattern caused by supplying an inspection signal to the pin. This arrangement may be represented by an equivalent circuit as shown in FIG. 16, in which a current generated on the sensor conductor is amplified by an amplifier circuit, and then the disconnection and short-circuit of the conductive pattern at a position opposed to the sensor conductor is detected based on the magnitude of the amplified current.

In the above conventional non-contact inspection technique, an electromagnetic wave from the conductive pattern has been received by an electrode having a size to substantially cover over a plurality of pattern lines on a standard circuit board. Thus, it has been impossible to inspect the circuit pattern in the level of 50 $\mu$m with a high degree of resolution. Further, even in a relatively large conductive pattern, it has not been able to go so far as detecting a chipping therein.

The present invention has been embodied to solve the above problems in the prior arts. It is therefore an object of the present invention to provide a sensor and inspection apparatus capable of inspecting the shape or geometry of the conductive pattern precisely.

DISCLOSURE OF THE INVENTION

In order to achieve the above object, according to a first aspect of the present invention, there is provided an inspection apparatus for inspecting a conductive pattern of a circuit board, in which a potential variation caused by applying an inspection signal to the conductive pattern is detected in a non-contact manner, which comprises detect means for detecting the potential variation in each portion of the conductive pattern by use of a plurality of sensor elements; and select means for outputting a select signal for selecting the sensor elements, wherein each of the sensor elements is formed either on a single-crystal of a semiconductor or on a flat plate, and each of the sensor elements includes a passive element operable as a counter electrode coupled capacitively with the conductive pattern to detect the potential variation in the conductive pattern, and a transistor adapted to output a detect signal in response to the select signal which is input into the transistor, the detect signal being output from the passive element.

The transistor may be a current-readout MOSFET. In this case, the passive element is continuously formed with a diffusion layer served as a source of the MOSFET to be electrically conductive thereto, and the detect signal is obtained from a drain of the MOSFET by inputting the select signal into a gate of the MOSFET.

The transistor may otherwise be a current-readout thin-film transistor. In this case, the passive element is connected to a source of the thin-film transistor, and the detect signal is obtained from a drain of the thin-film transistor by inputting the select signal into a gate of the thin-film transistor.

The transistor may otherwise be first and second MOSFETs connected in series with each other. In this case, the passive element is connected to a gate of the first MOSFET, and the select signal is connected to a gate of the second MOSFET. Further, a potential at a source of the first MOSFET is varied in response to the potential at the passive element applied to the gate of the first MOSFET, the varied potential being received by a drain of the second MOSFET, and the received potential being output from a source of the second MOSFET as the detect signal.

The transistor may otherwise be first and second thin-film transistors connected in series with each other. In this case, the passive element is connected to a gate of the first thin-film transistor, and the select signal is input to a gate of the second thin-film transistor. Further, a potential at a source of the first thin-film transistor is varied in response to the potential at the passive element applied to the gate of the first thin-film transistor, the varied potential being received by a drain of the second thin-film transistor, and the received potential being output from a source of the second thin-film transistor as the detect signal.

The transistor may otherwise be a bipolar transistor. In this case, the passive element is connected to an emitter of the bipolar transistor, and the detect signal is obtained from a collector of the bipolar transistor by inputting the select signal to a base of the bipolar transistor.

The transistor may otherwise be a charge-readout MOSFET. In this case, the passive element is formed continuously with a diffusion layer serving as a gate of the MOSFET to be electrically conductive thereto. Further, a potential barrier formed below the gate is lowered by inputting the select signal into the gate of the MOSFET, a signal charge residing in a source of the MOSFET being transferred to a drain of the MOSFET as a charge for the detect signal, and the detect signal being transferred by a charge-transfer element connected to the drain of the MOSFET.

In the above case, a charge-supply MOSFET for supplying a charge to the passive element in response to the potential variation in the conductive pattern and forming a potential barrier not to cause the backflow of the supplied charge before completing the potential variation in the conductive pattern may further be included. The charge-supply MOSFET may have a drain formed continuously with the diffusion layer serving as the passive element to be electrically conductive thereto.

The sensor elements according to the first aspect of the present invention may be arranged on a sensor chip in a matrix form.

The inspection apparatus according to the first aspect of the present invention may further include a conductor plate contacting the surface of the passive element.

According to a second aspect of the present invention, there is provided an inspection apparatus for inspecting a conductive pattern of a circuit board, which comprises supply means for supplying an temporally varied inspection signal to the conductive pattern; detect means for detecting a potential variation, corresponding to the inspection signal, in each portion of the conductive pattern by use of a plurality of sensor elements; and select means for outputting a select signal for selecting the sensor elements, wherein each of the sensor elements is formed on a single-crystal of a semiconductor, and each of the sensor elements includes a passive element operable as a counter electrode coupled capacitively with the conductive pattern to detect the potential variation of the conductive patter, and a transistor adapted to output a detect signal in response to the select signal which is input into the transistor, the detect signal being output from the passive element.

According to a third aspect of the present invention, there is provided an inspection apparatus for inspecting a conductive pattern of a circuit board, which comprises supply means for supplying an temporally varied inspection signal to the conductive pattern; detect means for detecting a potential variation, caused by supplying the inspection signal, in each portion of the conductive pattern by use of a plurality of sensor elements to output a detect signal corresponding to the potential variation; and select means for outputting a select signal for selecting the sensor elements, image data generating means for generating image data for representing a shape of the conductive pattern based on the detect signal, wherein each of the sensor elements is formed on a single-crystal of a semiconductor, and each of the sensor elements includes a passive element operable as a counter electrode coupled capacitively with the conductive pattern to detect the potential variation of the conductive patter, and a transistor adapted to output the detect signal in response to the select signal which is input into the transistor, the detect signal corresponding to the potential variation detected by the passive element.

The inspection apparatus according to the first to third aspect of the present invention may further include shading means for preventing light from irradiating the semiconductor serving as the sensor elements.

According to a fourth aspect of the present invention, there is provided a sensor for inspecting a conductive pattern of a circuit board, comprising a plurality of sensor elements for detecting a potential variation caused by supplying an inspection signal to the conductive pattern, in a non-contact manner, wherein each of the sensor elements is formed on a single-crystal of a semiconductor, and each of the sensor elements includes a passive element operable as a counter electrode coupled capacitively with the conductive pattern to detect the potential variation in the conductive pattern, and a transistor adapted to output a detect signal in response to the select signal which is input into the transistor, the detect signal being output from the passive element.

BEST MODE FOR CARRYING OUT THE INVENTION

With reference to the drawings, preferred embodiments of the present invention will now be illustratively described in detail. However, it is intended that the scope of the present invention is not limited only to relative configurations of each component, numerical values and others described in these embodiments, unless they are defined by a particular description.

(First Embodiment)

A first embodiment of the present invention will be described in conjunction with an inspection apparatus 1 using a MOSFET as a sensor element.

Figure 2:
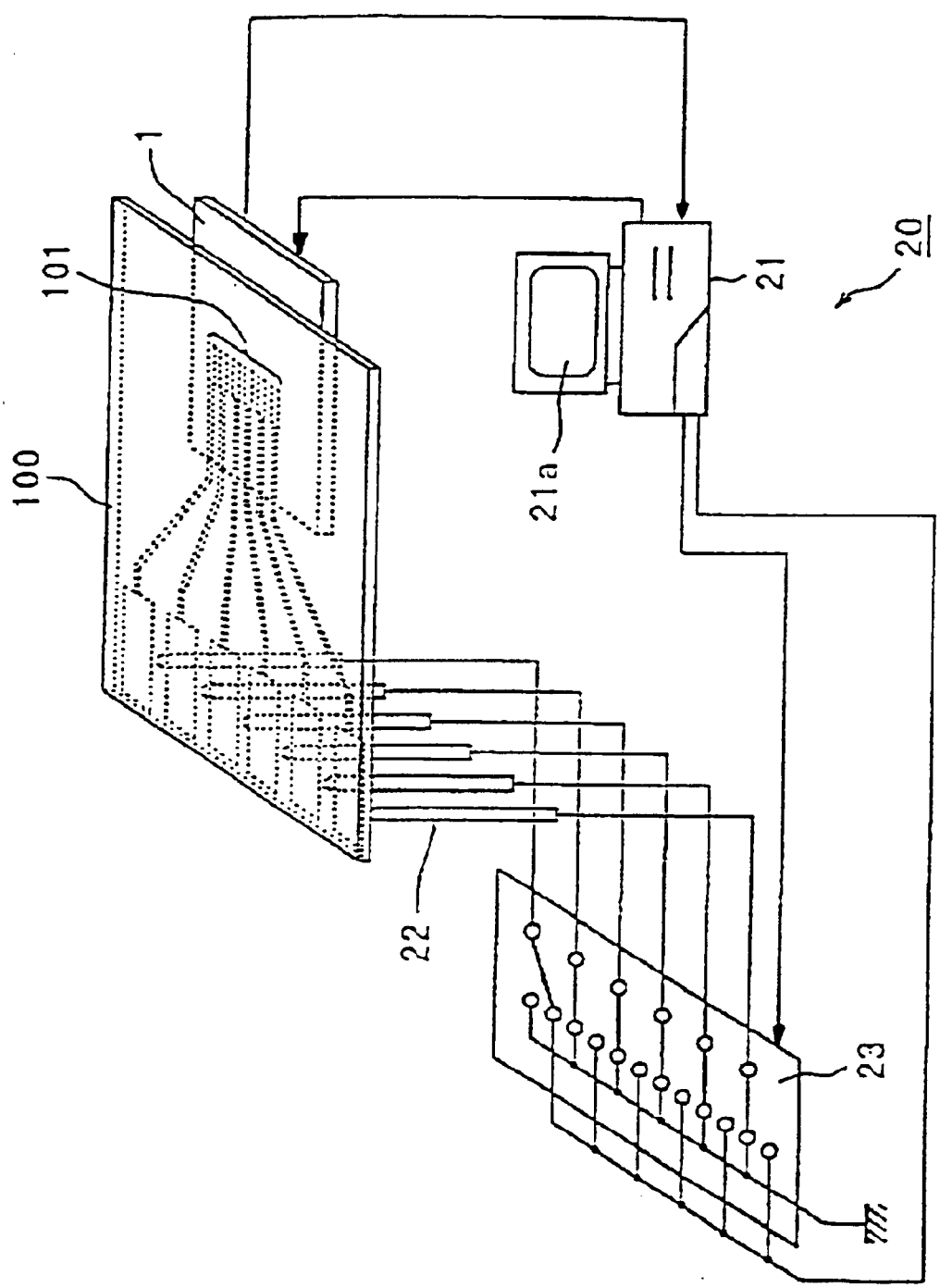
FIG. 2 is a schematic diagram of an inspection system using an inspection apparatus according to the first embodiment of the present invention.

An example of a conductive pattern inspection system using the inspection apparatus 1 will first be shown. FIG. 2 is a schematic diagram of the inspection system 20 using the inspection apparatus 1.

The inspection system 20 is provided for inspecting a conductive pattern 101 formed on a circuit board 100. The inspection system 20 comprises an inspection apparatus 1, a computer 21, a plurality of probes 22 each for supplying an inspection signal to the associated conductive pattern 101 and a selector 23 for switching the inspection signal to be supplied to at least one of the probes 22. For example, the selector 23 may be composed of a multiplexer or a duplexer.

The computer 21 supplies to the selector 23 a control signal for selecting at least one of the probes and the inspection signal to be supplied to the associated conductive pattern 101. The computer 21 also supplies to the inspection apparatus 1a synchronizing signal for allowing the inspection apparatus to be operated in sync with the control signal supplied to the selector 23. Further, the computer 21 receives a detect signal from the inspection apparatus 1 to form image data, and then detects disconnection, short-circuit, chipping or the like in the conductive pattern based on the image data. Furthermore, the computer 21 has a function of indicating an image of the inspected conductive pattern on a display 21a of the computer 21 based on the detect signal from each sensor elements 12a of the inspection apparatus 1.

Each of the probes 22 has a tip contacting one of the ends of the associated conductive pattern 101 on the circuit board 100 to supply the inspection signal to the conductive pattern 101.

The selector 23 is switched to select at least one of the probes 22 to which the inspection signal is output. Specifically, the selector 23 is controlled based on the control signal supplied from the computer to allow each of the plural independent conductive patterns 101 on the circuit board 100 to be supplied with the inspection signal separately.

The inspection apparatus 1 is positioned at a position opposed to the conductive pattern 101 on the circuit board 100 in a non-contact manner to detect a potential variation on the conductive pattern 101 caused by the inspection signal supplied from the probes 22 and then output the detected potential variation to the computer 21 as the detect signal. The distance between the inspection apparatus 1 and the conductive pattern is desirable to be 0.05 mm or less. However, the detect signal may be obtained by the distance of 0.5 mm or less.

While it is supposed that the circuit board 100 has the conductive pattern 101 formed only on one of the side surfaces thereof in the inspection system 100 of FIG. 2, a circuit board having the conductive pattern formed on both the side surfaces thereof may also be inspected. In this case, the inspection operation may be performed by preparing a pair of inspection apparatuses 1 and sandwiching the circuit board between them.

Figure 3:
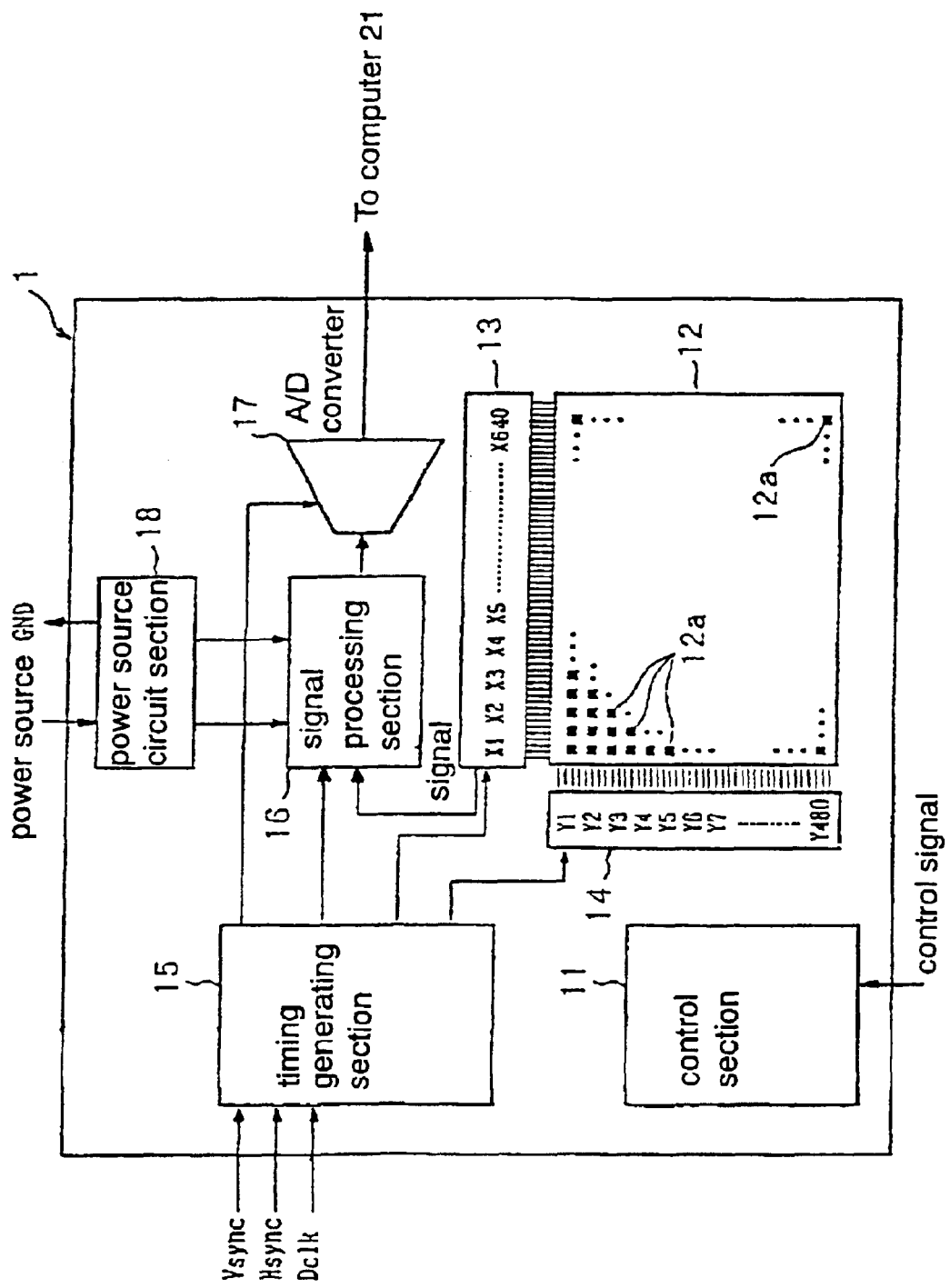
FIG. 3 is a block diagram showing an electrical construction of the inspection apparatus according to the first embodiment of the present invention.

FIG. 3 is a block diagram showing an electrical construction of the inspection apparatus 1. The inspection apparatus 1 has a construction in which a sensor chip having the electrical construction as shown in FIG. 3 is mounted on a package (not shown).

The inspection apparatus 1 comprises a control section 11, a sensor element group 12 including a plurality of sensor elements 12a, a vertical select section 14 to select a row of the sensor elements 12a, a lateral select section 13 to select a column of the sensor elements 12a and pick up a signal, a timing generating section 15 to generate a signal for selecting each sensor element 12a, a signal processing section 16 to process the signal from the lateral select section 13, an A/D converter 17 to perform an analog to digital conversion of a signal from the signal processing section 16, and a power source circuit section 18 to supply a power used for driving the inspection apparatus 1.

The control section 11 is provided for controlling the operation of the inspection apparatus 1 based on the control signal from the computer 21.

The sensor elements 12a are arranged in a matrix form (480 pieces in each column×640 pieces in each row), and detect in a non-contact manner the potential variation on the conductive pattern 101 caused by the inspection signal supplied from the probe 22 to the conductive pattern 101.

The timing generating section 15 is supplied with a vertical synchronizing signal (Vsync), a horizontal synchronizing signals (Hsync), and a reference signal (Dclk), from the computer 21, and then supplies a timing signal for selecting the sensor elements 12a to the vertical select section 14 and the lateral select section 13.

Based on the timing signal from the timing generating section 15, the vertical select section 14 selects at least one row sequentially from the sensor element group 12. Each of the sensor elements 12a belonging to the row selected by the vertical select section 14 outputs detect signals simultaneously, and the detect signals are input into the lateral select section 13. The lateral select section 13 amplifies the analog detect signals output from 640 terminals and then temporarily holds them. Then, the lateral select section 13 outputs the detect signals sequentially to the signal processing section 16 through a select circuit composed of a multiplexer or the like in response to the timing signal from the timing generating section 15.

The signal processing section 16 performs an analog signal conditioning to the detect signal from the lateral select section 13 and transfers the detect signal to the A/D converter 17.

The A/D converter 17 converts the detect signal input sent in analog form from the signal processing section 16 into a digital signal, for example, of 8-bit, and then outputs the converted detect signal.

While the A/D converter is integrated in the inspection apparatus 1 herein, the analog signal subjected to the analog signal conditioning may also be output to the computer 21 as it is.

Figure 1:
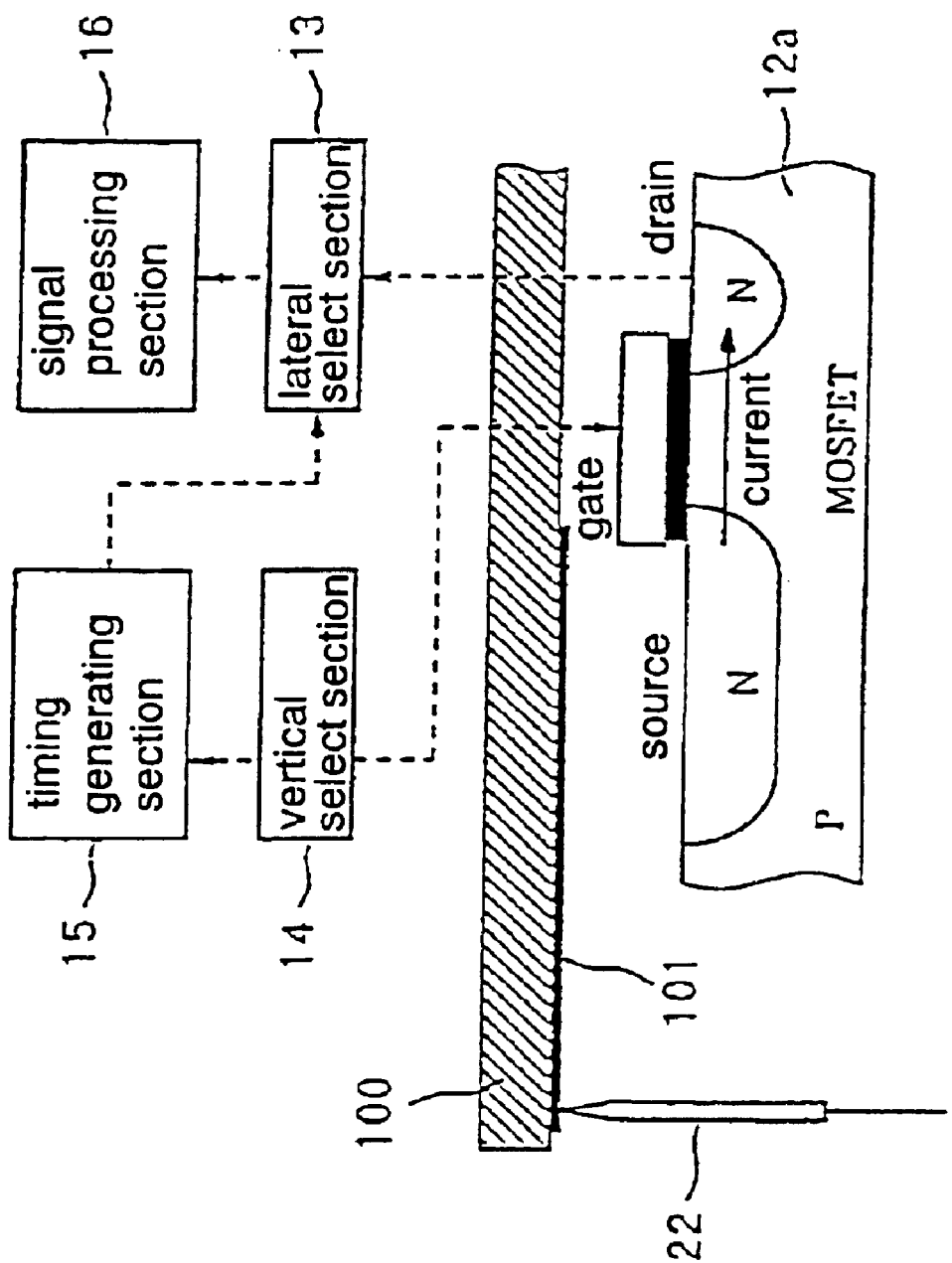
FIG. 1 is an explanatory block diagram of a sensor element according to a first embodiment of the present invention.

The operation of the sensor element 12a will now be described. FIG. 1 is an explanatory block diagram of one of the sensor elements 12a.

The sensor element 12a is a MOS field effect transistor (MOSFET), in which one of diffusion layers is formed to have a lager surface area than that of the other diffusion layer. The diffusion layer having the larger surface area serves as a passive element and is positioned opposed to the conductive pattern 101. The passive element is formed continuously with a source of the MOSFET to be electrically conductive thereto. The MOSFET also has a gate connected to the vertical select section 14, and a drain connected to the lateral select section 13.

The diffusion layer serving as the passive element is provided with a discharge potential barrier for discharging an unwanted charge. When the sensor element 12a is selected by the timing generating section 15 through the vertical select section 14, a signal is transmitted from the vertical select section 14 to the gate to turn on the sensor element 12a (i.e. to bring the sensor element 12a into a state ready to output the detect signal).

At this moment, when the inspection signal is output from the probe 22, the potential of the conductive pattern 101 is varied, and thereby a current flows from the source to the drain. This current serves as the detect signal which is transmitted to the signal processing section 16 through the lateral select section 13. If no conductive pattern 101 exists at the position opposed to the sensor element 12a, no current will flow. Thus, by analyzing the position of the sensor element 12a having the output current as the detect signal, the position on the circuit board 100 at which the conductive pattern 101 associated with the electrode contacting the probe 22 is located may be determined.

Figure 4:
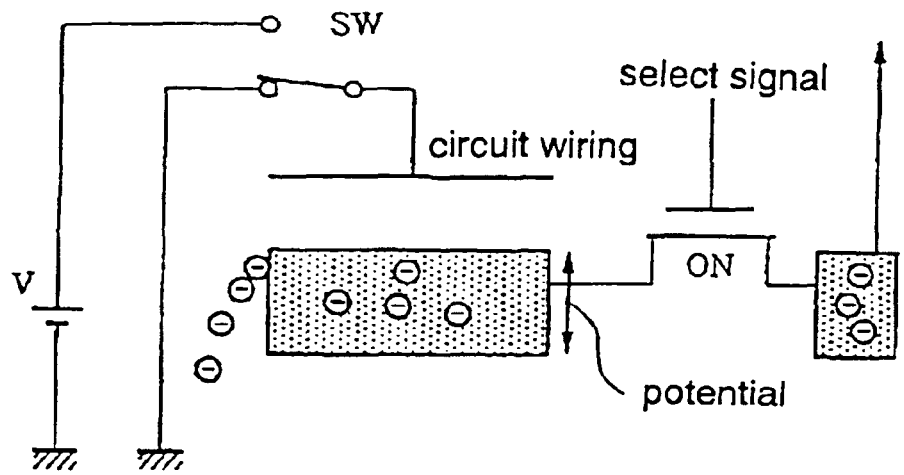
FIG. 4 is a model diagram demonstrating a principle on which a current in the sensor element according to the first embodiment of the present invention is generated in response to a potential variation in a conductive pattern.
Figure 5:
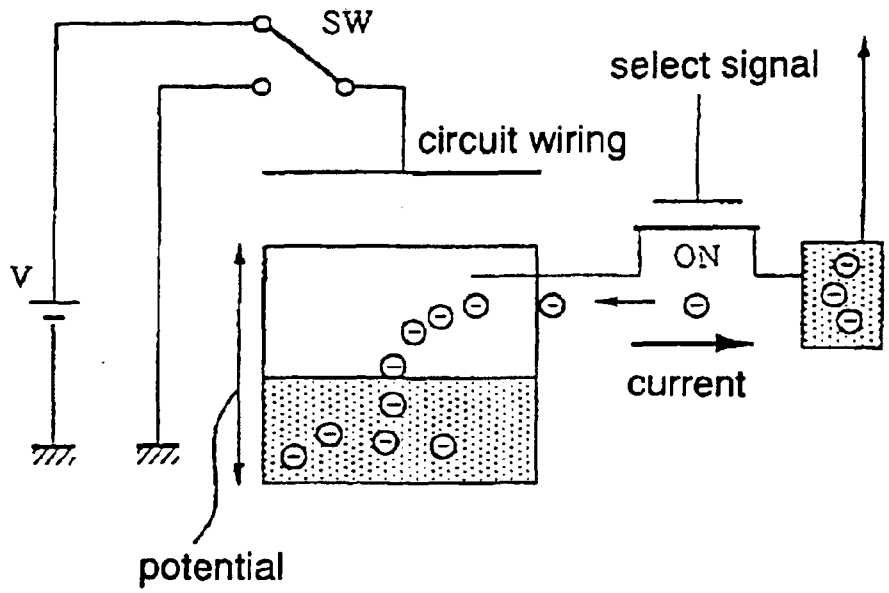
FIG. 5 is a model diagram demonstrating a principle on which a current in the sensor element according to the first embodiment of the present invention is generated in response to a potential variation in a conductive pattern.

A principle on which the flow of current is generated from the source to the drain of the MOFET will now be described in detail. FIGS. 4 and 5 are model diagrams for explaining this principle simply. FIG. 4 shows the state when no voltage is applied to the circuit wiring of the conductive pattern, and FIG. 5 shows the state when a certain voltage is applied to the circuit wiring. Both of these figures are shown in the state when the select signal is input to each gate and thereby each gate is turned on.

As shown in FIG. 4, if no voltage is applied to the circuit wiring, a surplus charge in the diffusion layer flows over from the discharge potential barrier having a lower potential than that of a potential barrier below the gate which is turned off. In this case, the potential of the source is defined by the potential of the discharge potential barrier.

As shown in FIG. 5, when a voltage V is applied to the circuit wiring, the circuit wiring is positively charged (at a potential V). Since the circuit wiring and the source-side diffusion layer are distanced at very close range, the source-side diffusion layer has the increased potential V by the influence of the potential variation in the circuit wiring, and thereby a charge flows into the source-side diffusion layer. That is to say, the source-side diffusion layer operates as if the circuit wiring and the source-side diffusion layer were capacitively coupled, so that the potential at the source-side diffusion layer is lowered to allow electrons to flow into the source-side diffusion layer or allow a current to flow from the source to the drain.

When the circuit wiring is connected to the ground again, the source-side diffusion layer gets back into the original potential, and thereby surplus electrons are released gradually from the discharge potential barrier.

Figure 6:
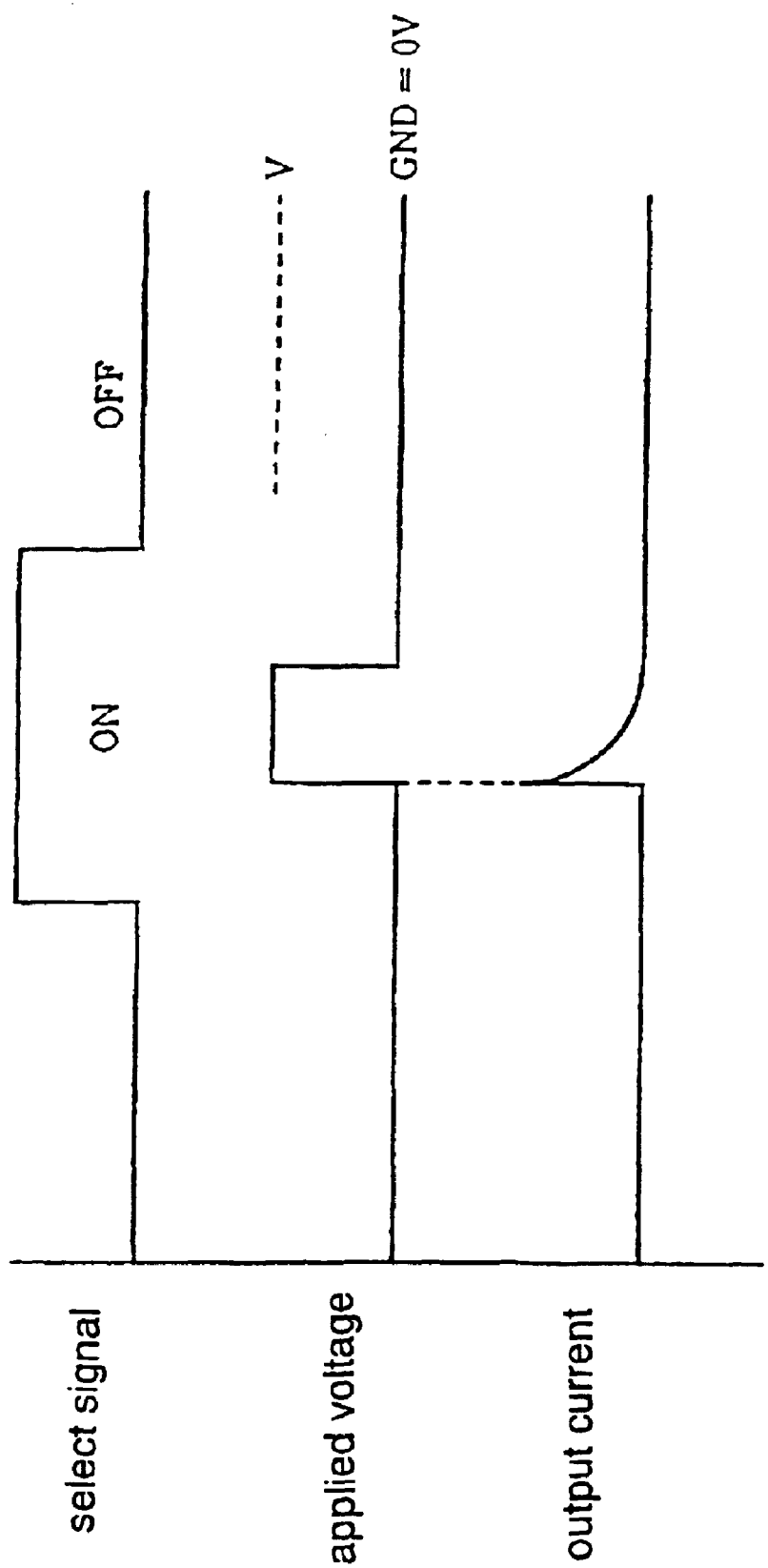
FIG. 6 is a timing chart showing input/output timings of the sensor element according to the first embodiment of the present invention.

FIG. 6 is a timing chart showing input/output timings in the case of using an MOSFET as shown in FIG. 1. As is shown in FIG. 6, an output current is provided by applying a voltage to the circuit wiring. The current exhibits its peak just after the voltage is applied and then the current exponentially decrease. Thus, the lateral select section 13 detects the current in response to the timing of applying the voltage and holds the detect state.

As described above, each of the sensor elements is formed on a single crystal of a semiconductor. Further, each of the sensor elements includes a passive element operable as a counter electrode coupled capacitively with the conductive pattern to detect the potential variation in the conductive pattern and an MOS transistor formed continuously with the passive element and adapted to output a current, which is output from the passive element as a detect signal, when the select signal is input into the gate of the transistor. Thus, the sensor elements may be superfinely manufactured.

In other words, since the sensor element group may be manufactured by use of existing established transistor manufacturing technologies as it is, not only each of the sensor elements itself but also each distance between the sensor elements may be superfinely formed. This allows the shape of the conductive pattern printed on a circuit board to be represented with a high degree of resolution, which provides accurate detection of chippings or the like in the conductive pattern. Further, no requirement for preparing particular manufacturing apparatuses to manufacture the sensor element group advantageously provides remarkably enhanced productivity.

While the sensor elements 12a are arranged two-dimensionally in conformity with the circuit board 100 in the inspection apparatus 1, a three-dimensional arrangement may also be applied.

As shown in FIG. 3, the sensor elements 12a are preferably uniformed in shape, because this allows each sensor element 12a to supply the inspection signal to the conductive pattern and receive the signal appearing at the conductive pattern without any deviation.

Further, as shown in FIG. 3, the sensor elements 12a is preferably arranged in a matrix form in which the sensor elements 12a are arranged at even intervals respectively in row and column directions, because this arrangement makes it possible not only to reduce the unevenness in the number of the sensor elements 12a per a unit area opposed to the conductive pattern but also to clarify the relative physical relationship between respective sensor elements 12a so as to facilitate determinations of the conductive pattern with the detect signal. However, only a single column of the sensor elements 12a may be arranged depending on the shape of the conductive pattern to be inspected.

While the inspection unit 1 has the arrangement of 480 rows and 640 columns, this arrangement has been selected only to simplify the description of this embodiment. Practically, the sensor elements 1 in the range of 200,000 to 2,000,000 may be arranged in every area of 5 $\mu m^2$. In order to achieve an accurate inspection, each size of the sensor elements 12a and each space between adjacent sensor elements 12a are preferably set depending on the line width of the conductive pattern.

While a N-channel MOSFET is used as each of the sensor elements in this embodiment, the present invention is not limited only to such a type, and a P-channel MOSFET may be used.

While an n-type diffusion layer is used as the passive element in FIG. 1, the present invention is not limited to such a type, and any material having relatively high conductivity, including amorphous semiconductors having such conductivity, may be applied.

Figure 7:
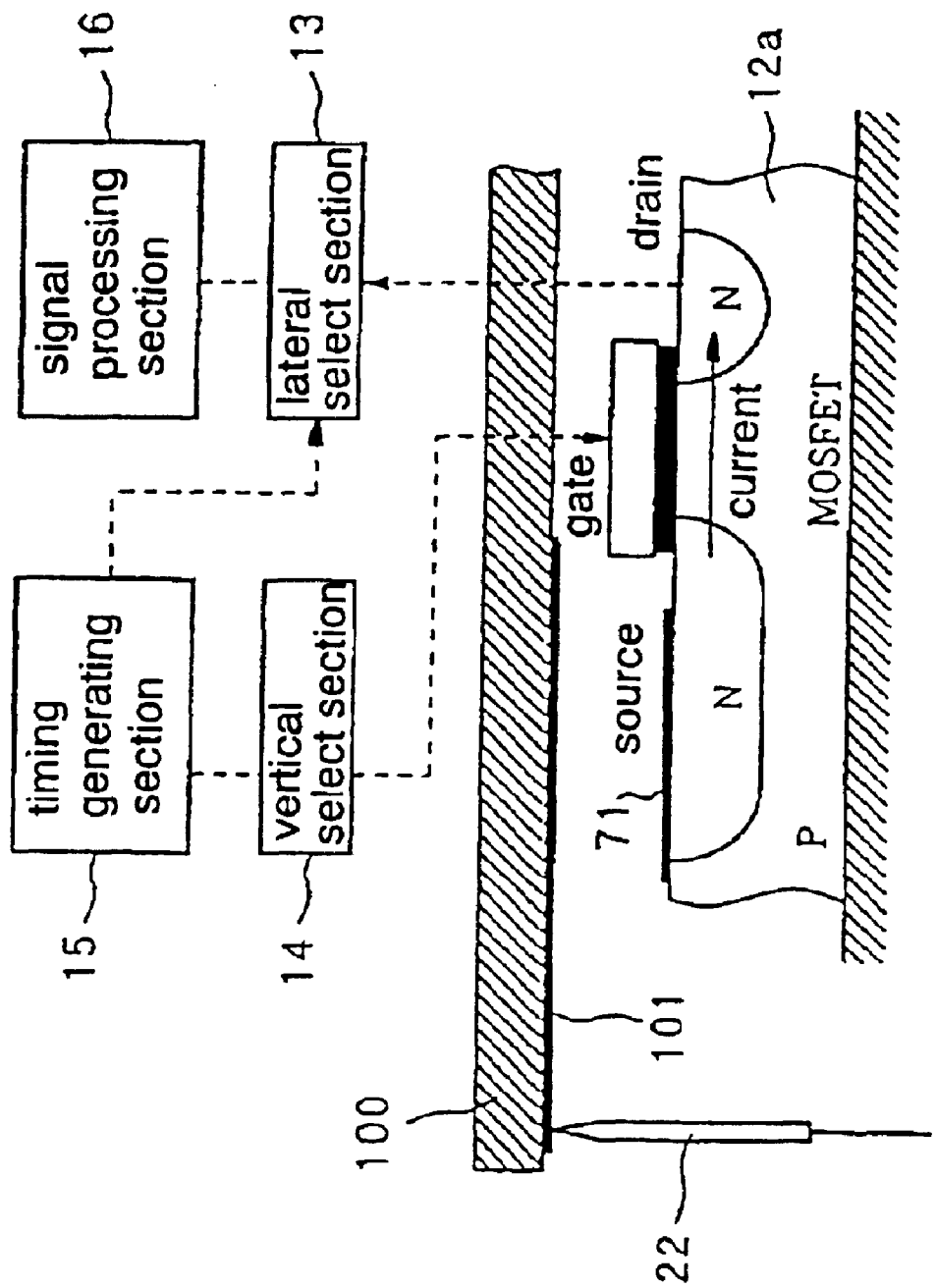
FIG. 7 is a block diagram showing an alternative example of the sensor element according to the first embodiment of the present invention.

Furthermore, as shown in FIG. 7, a conductor plate 71 may be provided on the source-side diffusion layer serving as the passive element to define an ohmic contact thereto. This allows the conductivity in the surface of the passive element to be increased. Thus, a signal charge may be concentrated in the vicinity of the surface of the passive element to increase the density of the signal charge, which provides stronger capacitive coupling. The conductor plate 71 may be formed of either a metallic film or a polycrystalline semiconductor.

(Second Embodiment)

An inspection apparatus as a second embodiment of the present invention will now be described with reference to FIGS. 8 to 12.

The inspection apparatus of this embodiment is different from that of the first embodiment in that this embodiment employs a charge-voltage conversion circuit in which a diffusion layer of a semiconductor serves as an element for receiving a signal from a circuit wiring. Since other components are similar to those of the first embodiment, the description about them will be omitted herein and the same components as those of the first embodiment will be defined by the same reference numerals in the drawings.

Figure 8:
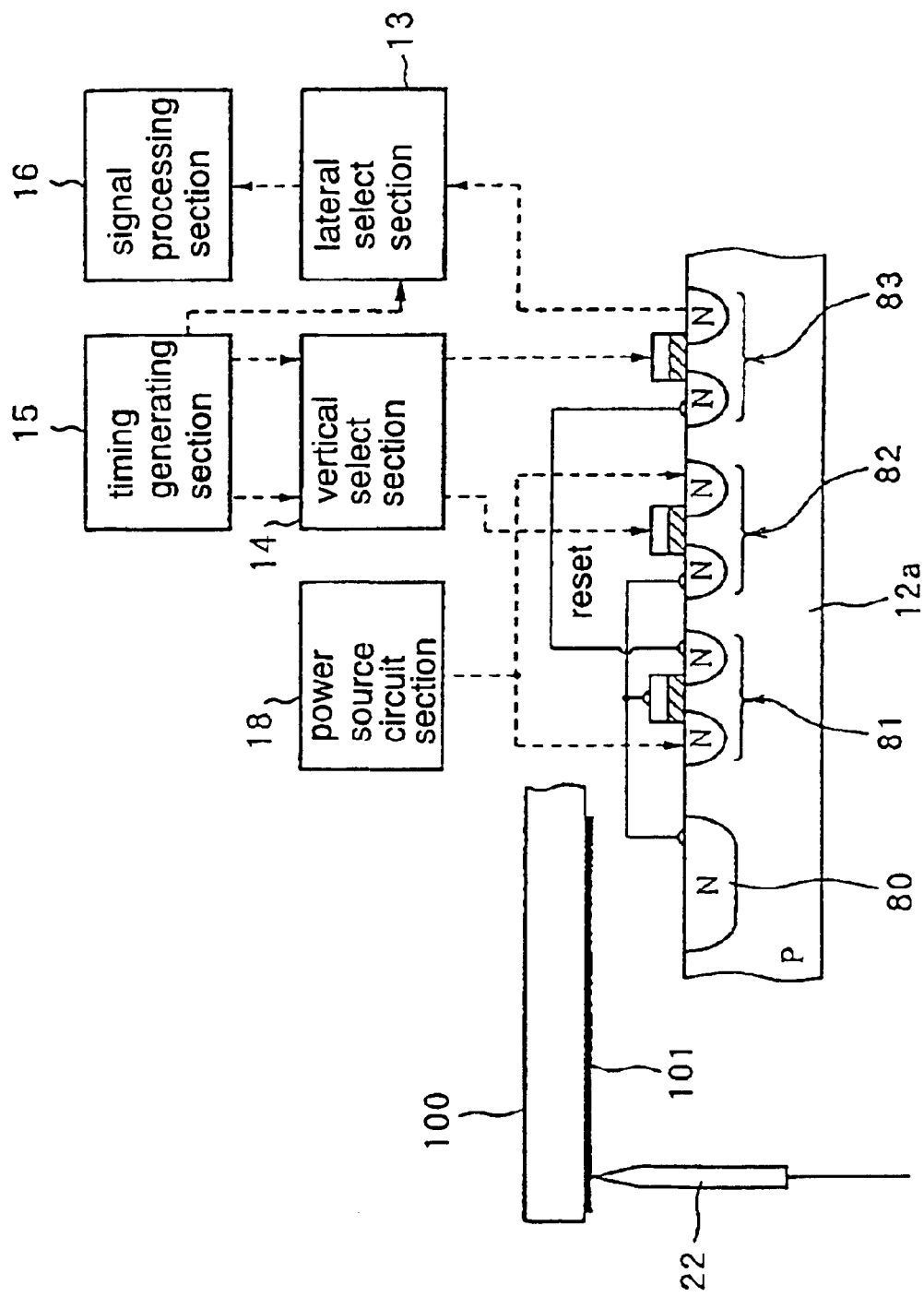
FIG. 8 is an explanatory block diagram of a sensor element according to a second embodiment of the present invention.

FIG. 8 is an explanatory block diagram of a sensor element according to this embodiment. As with the sensor element according to the first embodiment, a sensor element 12a according to this embodiment includes a diffusion layer having a relatively large surface area as a passive element 80. The passive element 80 is connected to a gate of a MOSFET 81 and a source of a MOSFET 82. A voltage VDD from a power source circuit section 18 is applied to a drain of the MODFET 81, and a source of the MOSFET 81 is connected to a drain of an MOSFET 83. A reset signal from a vertical select section 14 is input into a gate of the MOSFET 82, and a voltage VDD from a power source circuit section 18 is applied to a drain of the MOSFET 82. A select signal from the vertical select section 14 is input into a gate of the MOSFET 83, and an output from a source of the MOSFET 83 is input into a lateral select section 13.

Figure 9:
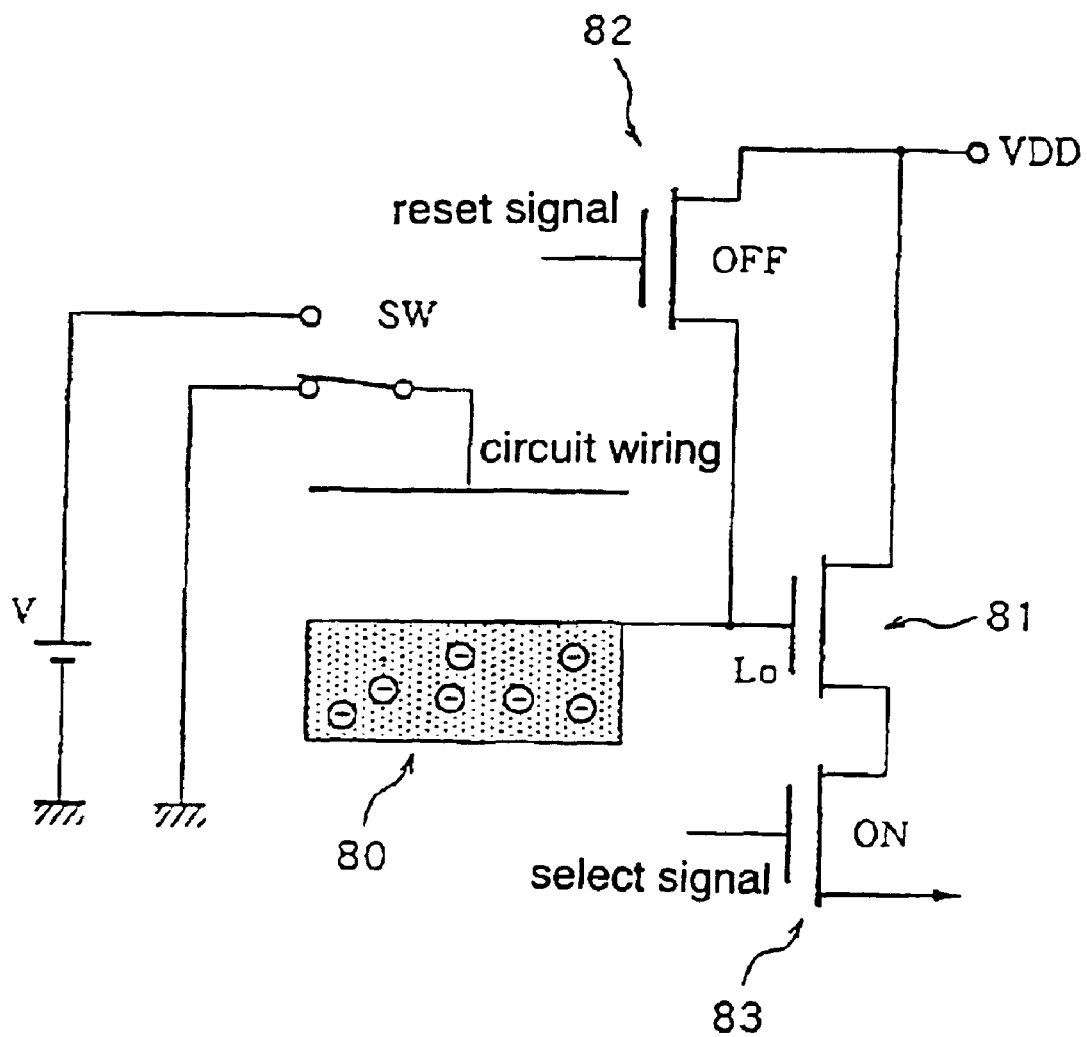
FIG. 9 is a model diagram demonstrating a principle on which a voltage in the sensor element according to the second embodiment of the present invention is output in response to a potential variation in a conductive pattern.
Figure 10:
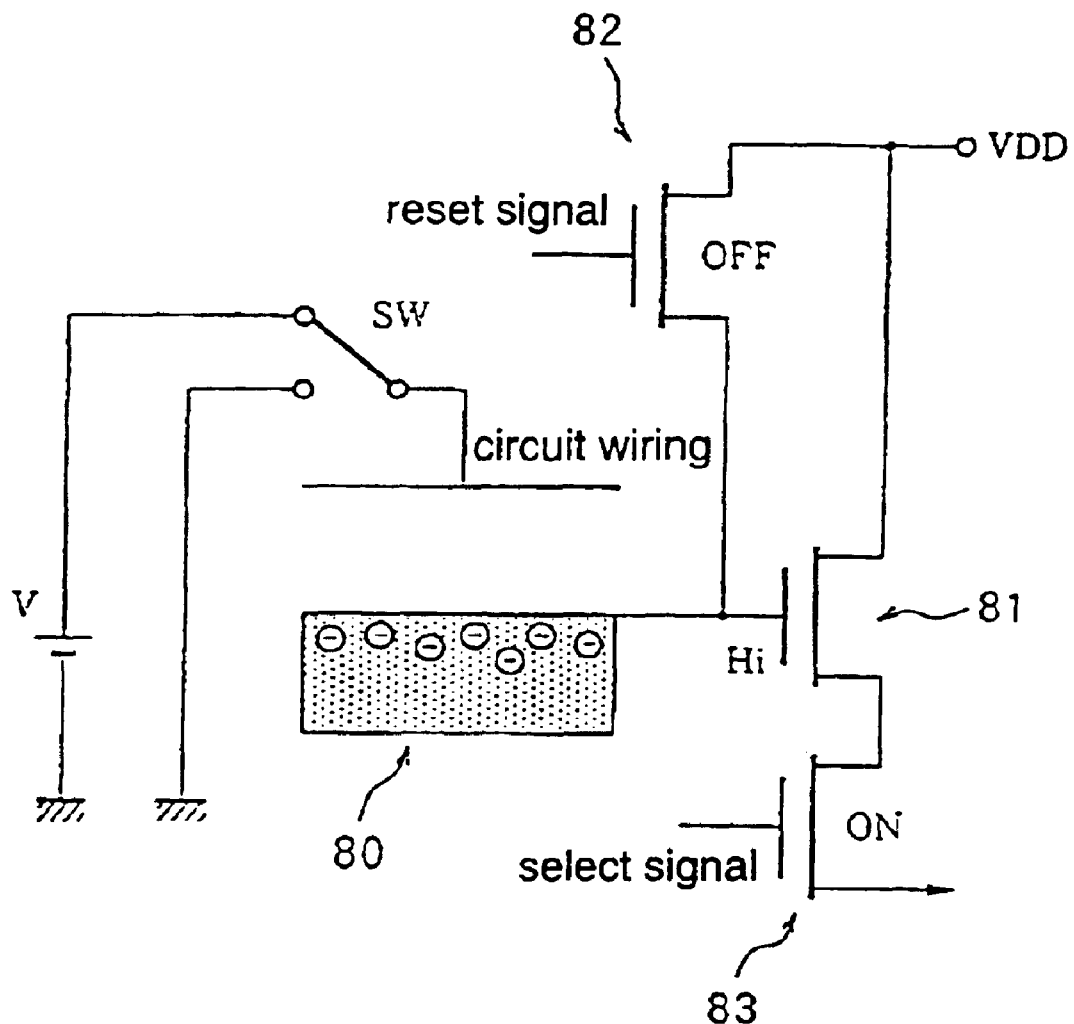
FIG. 10 is a model diagram demonstrating a principle on which a voltage in the sensor element according to the second embodiment of the present invention is output in response to a potential variation in a conductive pattern.

A principle on which a potential variation in a conductive pattern 101 detected by the passive element 80 is converted into an output voltage from the source of the MOSFET 83 will herein be described in detail. FIGS. 9 and 10 are model diagrams for explaining this principle simply. FIG. 9 shows the state when no voltage is applied to the circuit wiring of the conductive pattern, and FIG. 10 shows the state when a certain voltage is applied to the circuit wiring. Both of these figures are shown in the state when the select signal is input to the gate of the MOSFET 83 and thereby the gate is turned on.

As shown in FIG. 9, if no voltage is applied to the circuit wiring, electrons within the passive element 80 are confined within a potential well of the diffusion layer, and thereby a voltage Lo is applied to the gate of the MOSFET 81. Then, a potential lower than that of the gate of the MOSFET 81 by a threshold voltage of the MOSFET 81 is output to the source of the MOSFET 81 performing a source follower operation.

As shown in FIG. 10, when a voltage V is then applied to the circuit wiring, the electrons in the passive element 80 opposed to the circuit wiring tend to gather on the surface of the passive element 80 by the influence of the potential variation in the circuit wiring. However, since no electron flows additionally into the passive element 80, the originally existing electrons are concentrated near the surface of the passive element 80. This provides a drop of a surface potential of the passive element 80, i.e. an increased potential difference in the passive element 80. Since the gate of the MOSFET 81 is connected to the surface of the passive element 80, a higher voltage Hi is applied to the gate and a potential. Specifically, even if a potential lower than that of the gate of the MOSFET 81 by a threshold voltage of the MOSFET 81 is output to the source of the MOSFET 81 performing a source follower operation, a higher voltage than that in case of applying no voltage to the circuit wiring will be output to the source of the MOSFET 81.

When the circuit wiring is connected to the ground again, the electrons within the passive element 80 are dispersed again, and the potential at the gate of the MOSFET 81 is reduced down to Lo.

Figure 11:
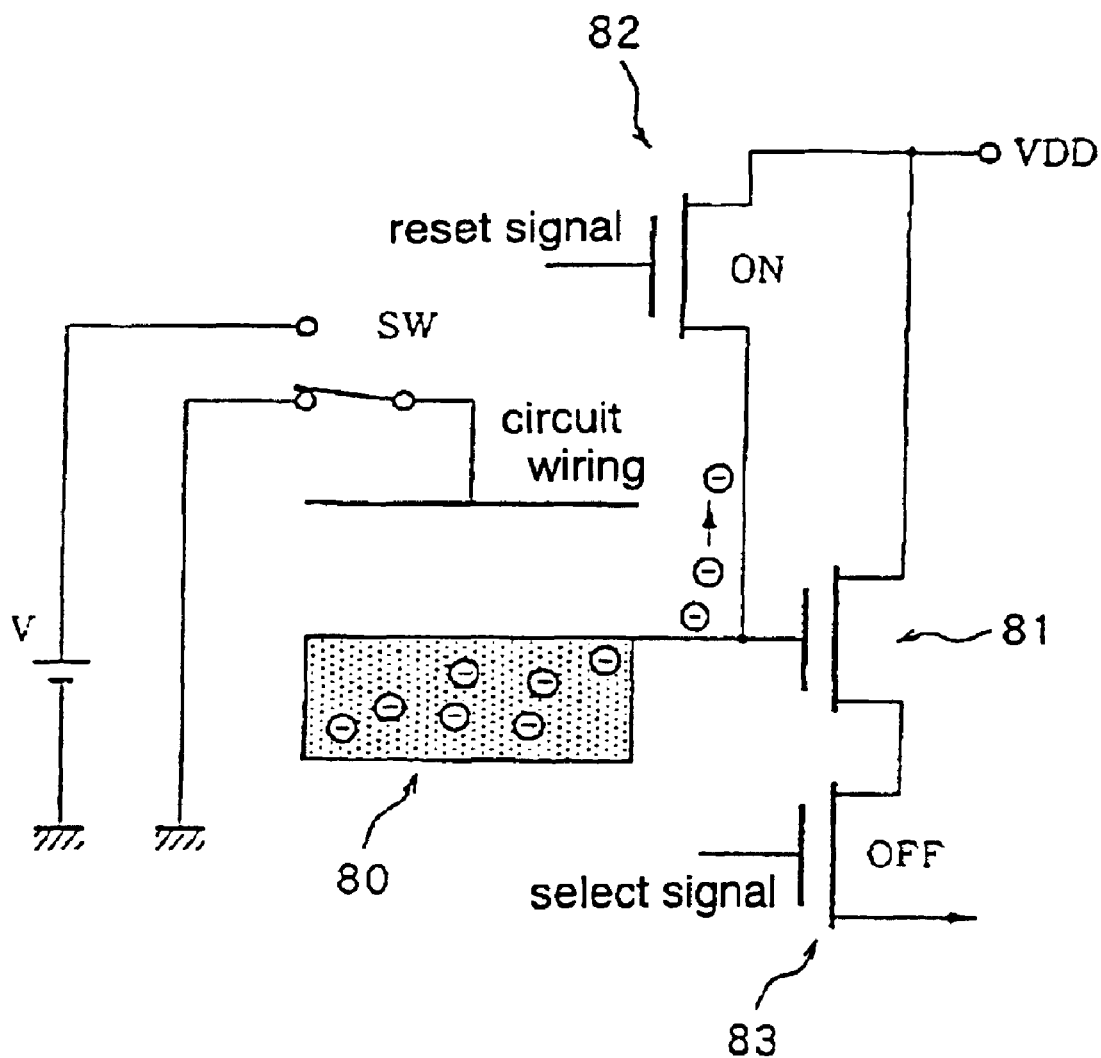
FIG. 11 is a model diagram demonstrating an operation in receiving a reset signal, in the sensor element according to the second embodiment of the present invention.

Thus, theoretically, the entire charge within the passive element 80 is not varied only by on-off switching the voltage to the circuit wiring. However, in practice, some electrons occasionally intrude from the surroundings of the passive element 80. If such a situation is left as it is, the potential of the passive element will go up without any voltage applied to the circuit wiring, and the potential difference or voltage will be lowered. This means that the noise potential caused by the above noise electrons is superposed on a receive signal from the circuit wiring as an offset potential and thereby the received signal is temporarily varied. From this point, as shown in FIG. 11, a reset signal is input into the gate of the MOSFET 82. This allows the passive element 80 to be connected to the power source, so tat surplus electrons within the passive element 80 may be released to keep the potential of the passive element 80 constant.

Figure 12:
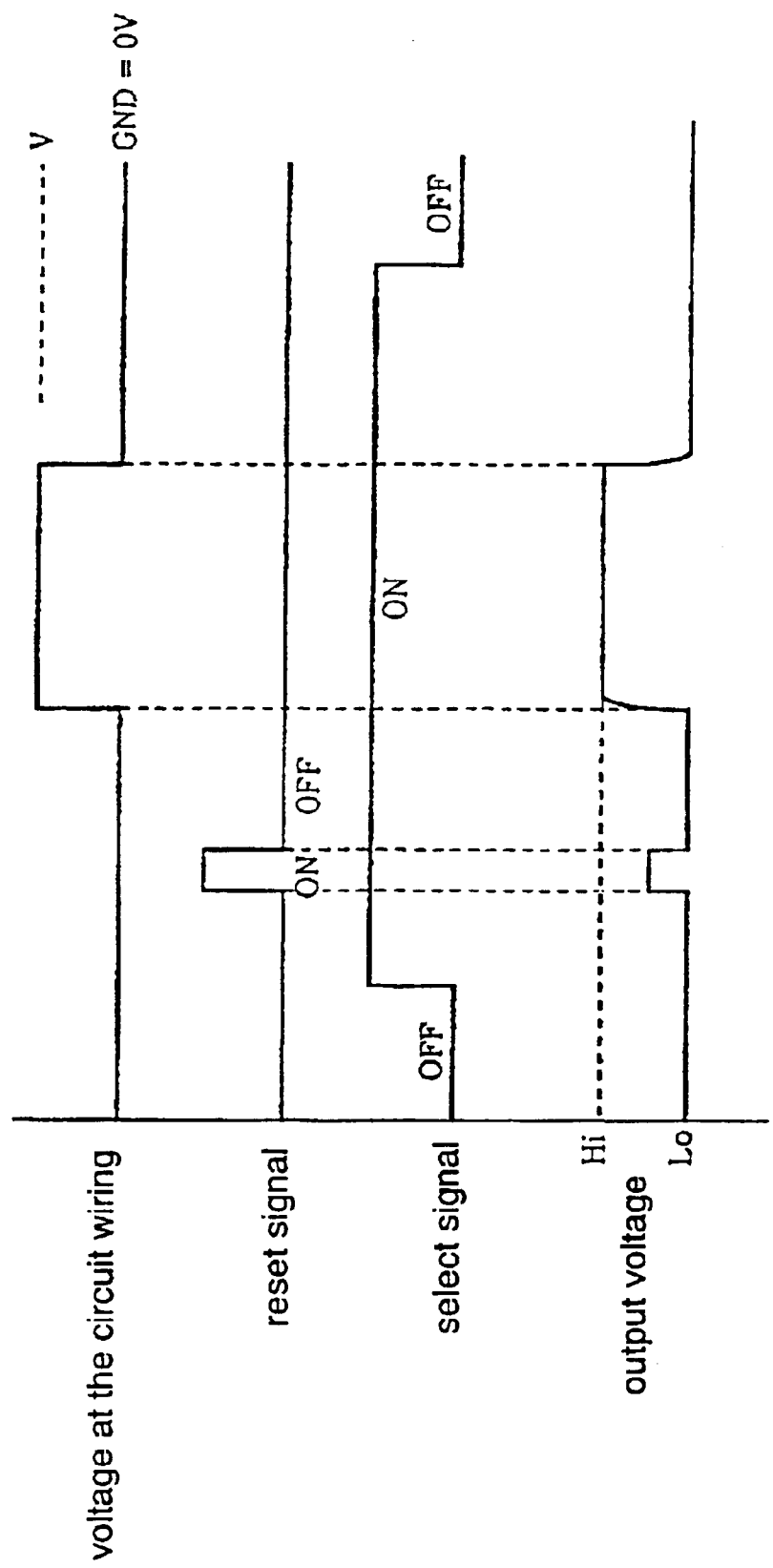
FIG. 12 is a timing chart showing input/output timings for the sensor element according to the second embodiment of the present invention.

FIG. 12 is a timing chart showing input/output timings for the inspection apparatus using the MOSFET circuit as shown in FIG. 8.

As shown in FIG. 12, a select signal is turned on, and then a reset signal is turned on for a given time period to suppress the temporal variation in the potential of the passive element 80. At this time, the potential at the gate of the MOSFET 81 is increased and the output voltage from the drain of the MOSFET 83 is slightly increased. This is referred to as a coupling noise of the reset signal. After turning off the reset signal, a voltage V is applied to the circuit wiring. When this output voltage is applied to the circuit wiring, the output voltage from the drain of the MOSFET 83 becomes the voltage Hi. Based on this, it may be recognized that the circuit wiring exists at the position opposed to the sensor element 12a.

In order not to detect the coupling noise in mistake for the output voltage, the timing for detecting the output voltage is suitably adjusted or the output voltage is passed through a high-pass filter.

As described above, by using a charge-voltage conversion circuit as shown in FIG. 8 as the sensor element, the detect signal may be picked up in the form of an amplified voltage so as to discriminate the detect signal more clearly. This allows the inspection of the circuit board to be performed with a higher degree of accuracy.

The input timing of the reset signal is not limited to the timing shown in FIG. 12, and any other suitable timing may be used.

Further, while the passive element 80 is formed in an n-type diffusion layer in FIG. 8, the present invention is not limited to this embodiment, and any material having relatively high conductivity, including metallic films, polycrystalline semiconductors or amorphous semiconductors having such conductivity, may be applied.

(Third Embodiment)

An inspection apparatus as a third embodiment of the present invention will now be described with reference to FIG. 13.

The inspection apparatus of this embodiment is different from that of the first embodiment in that this embodiment employs a bipolar transistor as the sensor element. Since other components are similar to those of the first embodiment, the description about them will be omitted herein and the same components as those of the first embodiment will be defined by the same reference numerals in the drawings.

Figure 13:
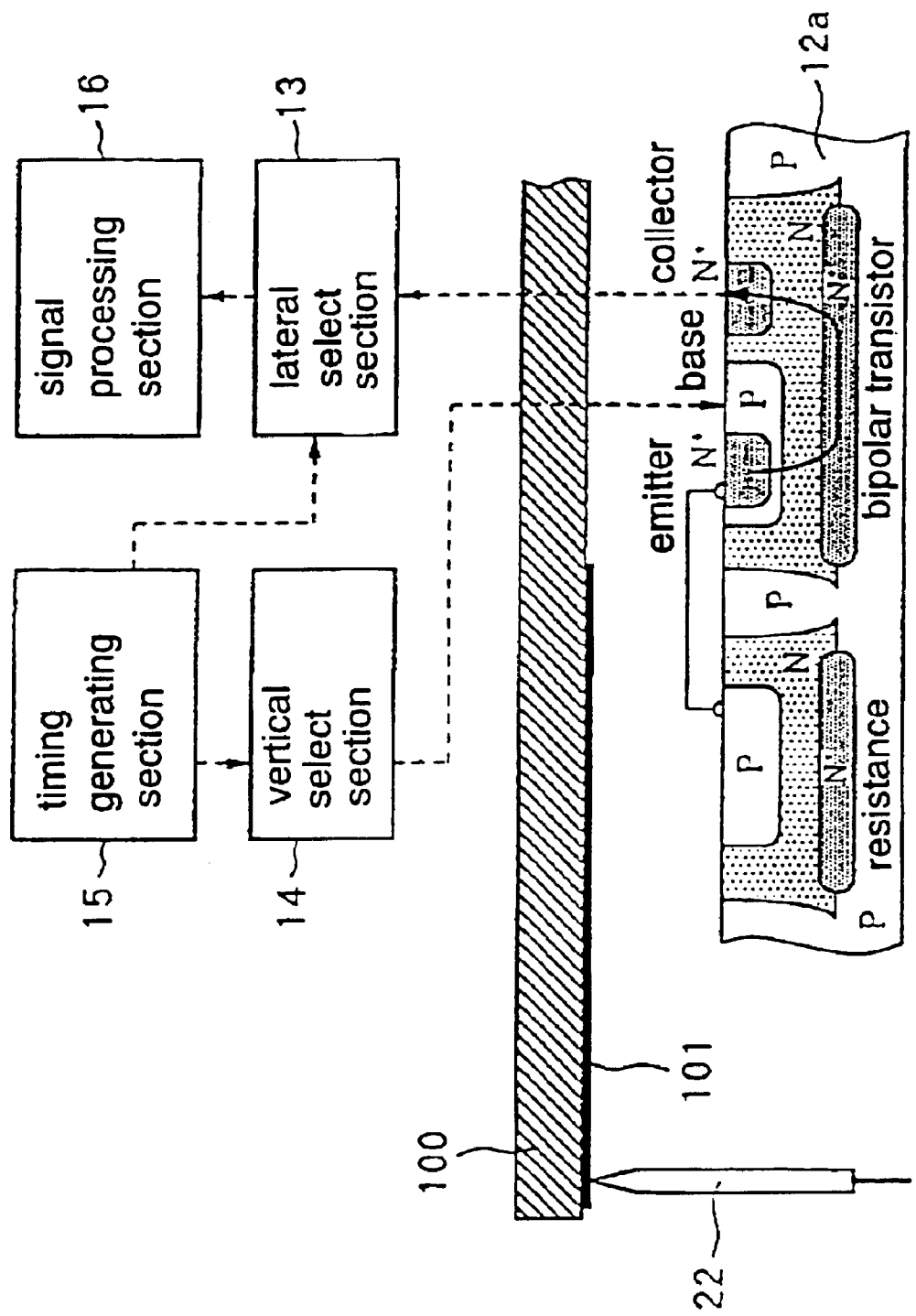
FIG. 13 is an explanatory block diagram of a sensor element according to a third embodiment of the present invention.

FIG. 13 is an explanatory block diagram of a sensor element according to this embodiment.

A passive element for detecting the potential variation in the conductive pattern is composed of a resistive element, and an emitter of the bipolar transistor is connected to the resistive element. A select signal from a vertical select section 14 is input into a base of the bipolar transistor, and an output current output from a collector of the bipolar transistor as the detect signal is input into a signal processing section 16 through a lateral select section 13.

An operation of the sensor element 12a is almost similar to that of the MOSFET described in FIGS. 4 and 5. When a select signal is applied to the base of the bipolar transistor, the N+diffusion layer serving as the emitter of the bipolar transistor and the N+diffusion layer serving as the collector of the bipolar transistor are conducted each other. Then, when the potential at the circuit wiring is increased and thereby electrons are concentrated on a p diffusion layer of the resistive element, a current is output from the collector. This current is amplified at the lateral select section 13, and then is input into the signal processing section 16 in response to a timing signal formed in a timing generating section 15.

Thus, using the bipolar transistor as the sensor element allows the detect signal to be output at a high speed and with precision.

While the NPN bipolar transistor is used in this embodiment, a PNP bipolar transistor may be applied.

(Fourth Embodiment)

An inspection apparatus as a fourth embodiment of the present invention will now be described with reference to FIG. 14.

The inspection apparatus of this embodiment is different from that of the first embodiment in that this embodiment employs a thin-film transistor (TFT) as the sensor element. Since other components are similar to those of the first embodiment, the description about them will be omitted herein and the same components as those of the first embodiment will be defined by the same reference numerals in the drawings.

Figure 14:
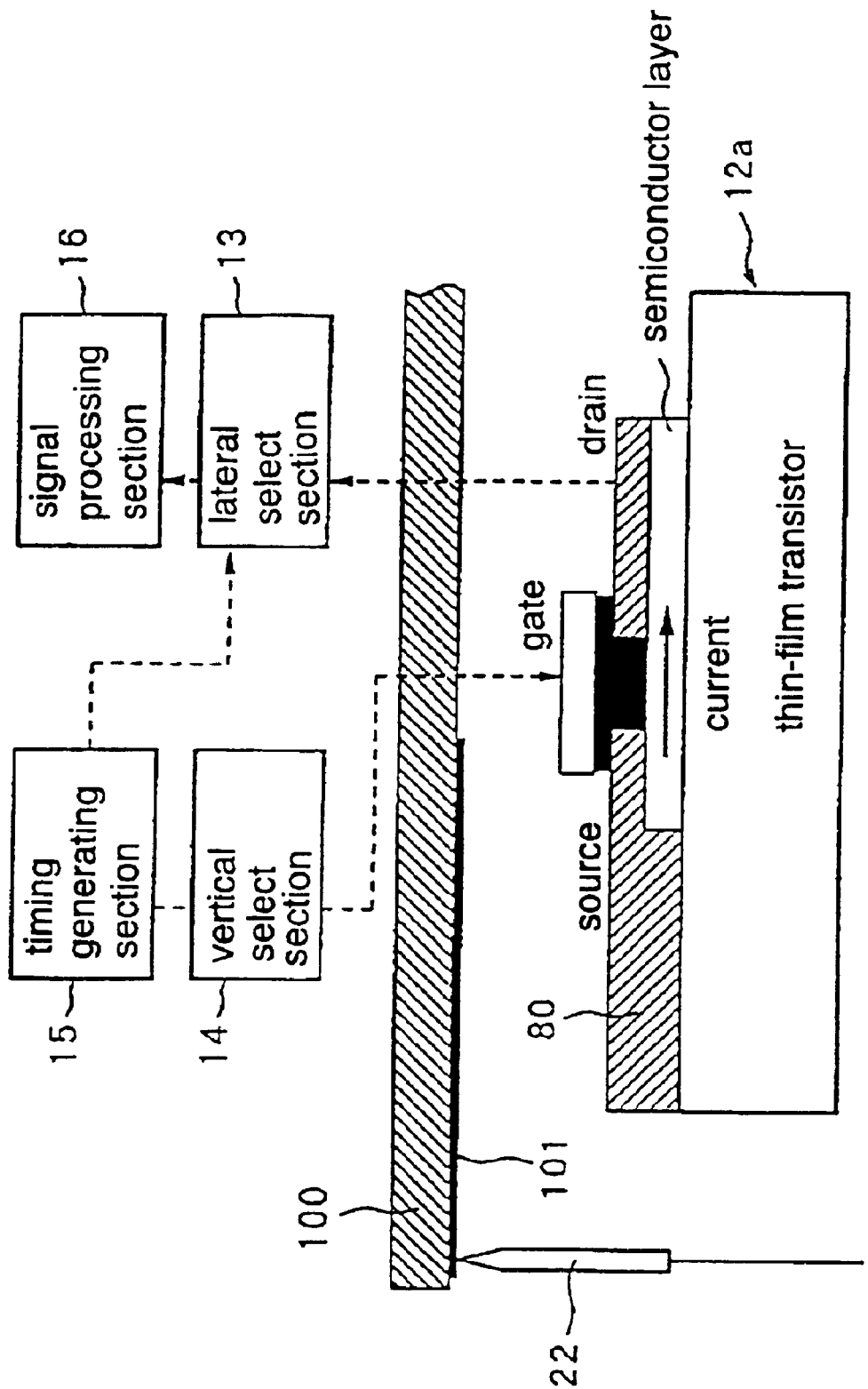
FIG. 14 is an explanatory block diagram of a sensor element according to a fourth embodiment of the present invention.
Figure 15:
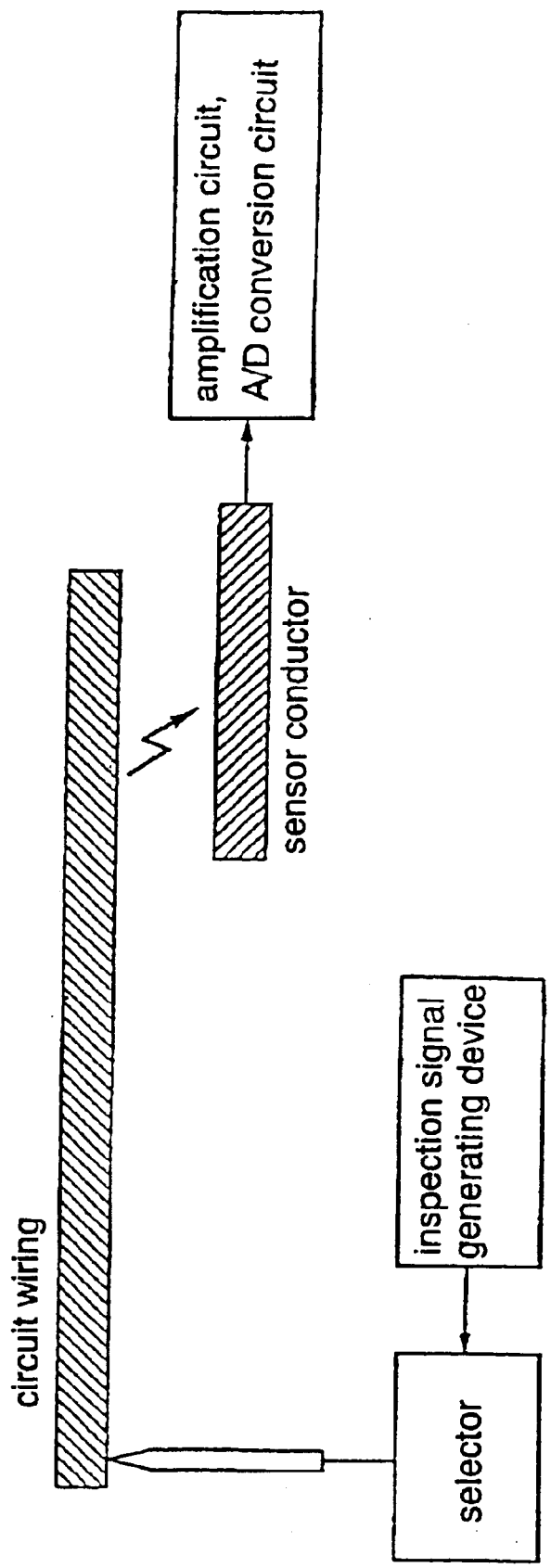
FIG. 15 is an explanatory diagram of a conventional circuit board inspection apparatus.
Figure 16:
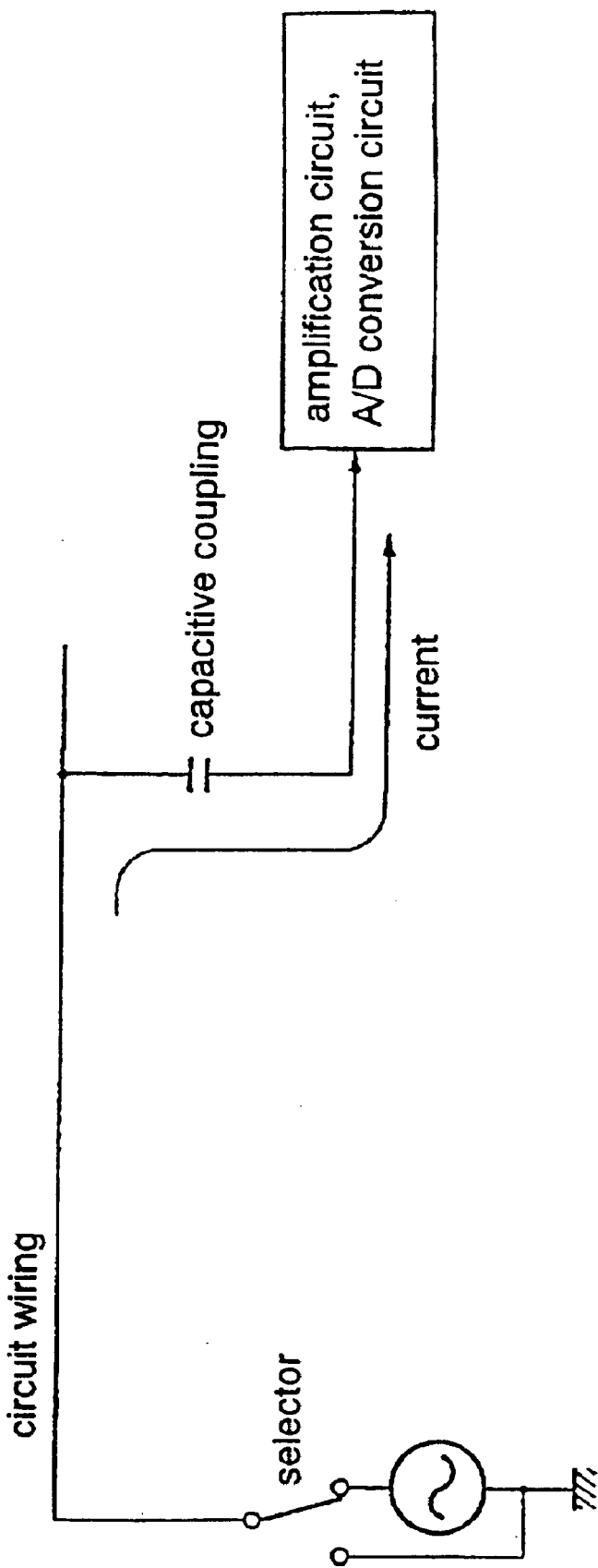
FIG. 16 is an explanatory diagram of a conventional circuit board inspection apparatus.

FIG. 14 is an explanatory block diagram of a sensor element according to this embodiment.

A passive element 80 for detecting the potential variation in a conductive pattern is an electrode formed of chromium or the like, and the electrode is formed continuously with a source of the thin-film transistor to be electrically conductive thereto. A select signal from a vertical select section 14 is input into a gate of the thin-film transistor, and an output current output from a drain of the thin-film transistor as the detect signal is input into a signal processing section 16 through a lateral select section 13. A thin-film transistor layer formed of an amorphous Si, polycrystalline Si or the like is provided as an under layer of the source and drain of the thin-film transistor.

An operation of this sensor element 12a is almost similar to that of the MOSFET described in FIGS. 4 and 5. When the select signal is applied to the gate of the thin-film transistor, a channel is generated in the semiconductor layer under the gate, and thereby the source and drain of the thin-film transistor is conducted each other. Then, when the potential at the circuit wiring is increased and thereby electrons are concentrated on the electrode as the passive element 80, a current is output from the drain. This current is amplified at the lateral select section 13, and then is input into the signal processing section 16 in response to a timing signal formed in a timing generating section 15.

Thus, using the thin-film transistor as the sensor element allows the productivity of the sensor element to be improved and allows the area of the sensor array to be enlarged.

In the charge-voltage conversion circuit described in the second embodiment, this thin-film transistor may substitute for each of the MOSFETs. In this case, the same effect may be obtained.

(Another Embodiment)

A function of holding electrons flowing into the sensor element may be provided to the first, third and forth embodiments.

More specifically, if the passive element is provided with a structure capable of storing electrons therein, the stored electrons will be held until they are sucked up by a reset MOS transistor. In this case, the output current as the detect signal may be detected between the time just after the initiation of applying the voltage to the circuit wiring as the detect signal after selecting the sensor element and the time when the sensor element is reset. Thus, as described in conjunction with FIG. 6, the timing of applying the voltage is not required to match with the timing of detecting the output current.

Additionally, a charge transfer element may be used to transfer the stored electrons to the adjacent sensor element in order. For example, the charge transfer element includes a CCD.

In this case, a charge-readout MOSFET may be used as the transistor. Then, the passive element may be formed continuously with a diffusion layer serving as a source of the charge-readout MOSFET to be electrically conductive thereto, and the select signal may be input into a gate of the charge-readout MOSFET to lower a potential barrier formed below the gate. Further, a signal charge residing in the source may be transferred to a drain of the charge-readout MOSFET as a charge for the detect signal, and then the detect signal may be transferred by a charge-transfer element connected to the drain.

Furthermore, a charge-supply MOSFET for supplying a charge to the passive element in response to the potential variation in the conductive pattern and forming a potential barrier not to cause the backflow of the supplied charge before completing the potential variation in the conductive pattern may be provided, and a drain of charge-supply MOSFET may be formed continuously with the diffusion layer serving as the passive element to provide a stable charge transfer, to be electrically conductive thereto.

Using the charge-transfer element will also eliminate the need for providing a switching circuit, such as a multiplexer, to the lateral select section.

While the above embodiments have been described as if an DC voltage were applied to the circuit wiring of the conductive pattern, the invention is not limited only to this manner, and an AC voltage may be applied to the circuit wiring.

Since all of the sensor elements in the above embodiments are semiconductor sensors, irradiating light can cause a photoelectric conversion, resulting in generated electrons. This can lead to an improper operating of the inspection apparatus. Thus, it is desirable to shield around the sensor element from light.

Industrial Applicability

According to the present invention, a sensor and inspection apparatus capable of finely inspecting a shape of a conductive pattern may be provided.

What is claimed is:

1. An inspection apparatus for inspecting a conductive pattern of a circuit board, in which a potential variation caused by applying an inspection signal to said conductive pattern is detected in a non-contact manner, said inspection apparatus comprising:

detect means for detecting the potential variation in each portion of said conductive pattern by use of a plurality of sensor elements; and select means for outputting a select signal for selecting said sensor elements, wherein each of said sensor elements is formed either on a single-crystal of a semiconductor or on a flat plate, and each of said sensor elements includes;

a passive element operable as a counter electrode coupled capacitively with said conductive pattern to detect the potential variation in said conductive pattern, and a transistor adapted to output a detect signal in response to said select signal which is input into said transistor, said detect signal being output from said passive element.

2. An inspection apparatus as defined in claim 1, wherein said transistor is a current-readout MOSFET, wherein said passive element is continuously formed with a diffusion layer served as a source of said MOSFET to be electrically conductive thereto, and said detect signal is obtained from a drain of said MOSFET by inputting said select signal into a gate of said MOSFET.

3. An inspection apparatus as defined in claim 1, wherein said transistor is a current-readout thin-film transistor, wherein said passive element is connected to a source of said thin-film transistor, and said detect signal is obtained from a drain of said thin-film transistor by inputting said select signal into a gate of said thin-film transistor.

4. An inspection apparatus as defined in claim 1, wherein said transistor is first and second MOSFETs connected in series with each other, wherein said passive element is connected to a gate of said first MOSFET, and said select signal is connected to a gate of said second MOSFET, wherein a potential at a source of said first MOSFET is varied in response to the potential at said passive element applied to said gate of said first MOSFET, said varied potential being received by a drain of said second MOSFET, and said received potential being output from a source of said second MOSFET as said detect signal.

5. An inspection apparatus as defined in claim 1, wherein said transistor is first and second thin-film transistors connected in series with each other, wherein said passive element is connected to a gate of said first thin-film transistor, and said select signal is input to a gate of said second thin-film transistor, wherein a potential at a source of said first thin-film transistor is varied in response to the potential at said passive element applied to said gate of said first thin-film transistor, said varied potential being received by a drain of said second thin-film transistor, and said received potential being output from a source of said second thin-film transistor as said detect signal.

6. An inspection apparatus as defined in claim 1, wherein said transistor is a bipolar transistor, wherein said passive element is connected to an emitter of said bipolar transistor, and said detect signal is obtained from a collector of said bipolar transistor by inputting said select signal to a base of said bipolar transistor.

7. An inspection apparatus as defined in claim 1, wherein said transistor is a charge-readout MOSFET, wherein said passive element is formed continuously with a diffusion layer serving as a gate of said MOSFET to be electrically conductive thereto, wherein a potential barrier formed below said gate is lowered by inputting said select signal into said gate of said MOSFET, a signal charge residing in a source of said MOSFET being transferred to a drain of said MOSFET as a charge for said detect signal, and said detect signal being transferred by a charge-transfer element connected to said drain of said MOSFET.

8. An inspection apparatus as defined in claim 7, which further includes a charge-supply MOSFET for supplying a charge to said passive element in response to the potential variation in said conductive pattern and forming a potential barrier not to cause the backflow of said supplied charge before completing the potential variation in said conductive pattern, said charge-supply MOSFET having a drain formed continuously with said diffusion layer serving as said passive element to be electrically conductive thereto.

9. An inspection apparatus as defined in claim 1, wherein said sensor elements are arranged on a sensor chip in a matrix form.

10. An inspection apparatus as defined in claim 1, which further includes a conductor plate contacting the surface of said passive element.

11. An inspection apparatus for inspecting a conductive pattern of a circuit board, comprising:
supply means for supplying an temporally varied inspection signal to said conductive pattern;
detect means for detecting a potential variation, corresponding to said inspection signal, in each portion of said conductive pattern by use of a plurality of sensor elements; and
select means for outputting a select signal for selecting said sensor elements, wherein
each of said sensor elements is formed on a single-crystal of a semiconductor, and
each of said sensor elements includes;
a passive element operable as a counter electrode coupled capacitively with said conductive pattern to detect the potential variation of said conductive patter, and
a transistor adapted to output a detect signal in response to said select signal which is input into said transistor, said detect signal being output from said passive element.

12. An inspection apparatus for inspecting a conductive pattern of a circuit board, comprising:
supply means for supplying an temporally varied inspection signal to said conductive pattern;
detect means for detecting a potential variation, caused by supplying said inspection signal, in each portion of said conductive pattern by use of a plurality of sensor elements to output a detect signal corresponding to said potential variation; and
select means for outputting a select signal for selecting said sensor elements,
image data generating means for generating image data for representing a shape of said conductive pattern based on said detect signal, wherein
each of said sensor elements is formed on a single-crystal of a semiconductor, and
each of said sensor elements includes;
a passive element operable as a counter electrode coupled capacitively with said conductive pattern to detect the potential variation of said conductive patter, and
a transistor adapted to output said detect signal in response to said select signal which is input into said transistor, said detect signal corresponding to the potential variation detected by said passive element.

13. An inspection apparatus as defined in claim 12, which further includes shading means for preventing light from irradiating said semiconductor serving as said sensor elements.

14. A sensor for inspecting a conductive pattern of a circuit board, said sensor comprising a plurality of sensor elements for detecting a potential variation caused by supplying an inspection signal to said conductive pattern, in a non-contact manner, wherein
each of said sensor elements is formed on a single-crystal of a semiconductor, and
each of said sensor elements includes;
a passive element operable as a counter electrode coupled capacitively with said conductive pattern to detect the potential variation in said conductive pattern, and
a transistor adapted to output a detect signal in response to said select signal which is input into said transistor, said detect signal being output from said passive element.

* * * * *